(12) United States Patent
Uchida

(10) Patent No.: US 6,614,112 B2
(45) Date of Patent: Sep. 2, 2003

(54) SEMICONDUCTOR DEVICE WITH SHOCK ABSORBING BOND PAD

(75) Inventor: Yasufumi Uchida, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 52 days.

(21) Appl. No.: 10/109,727

(22) Filed: Apr. 1, 2002

(65) Prior Publication Data

US 2003/0052412 A1 Mar. 20, 2003

(30) Foreign Application Priority Data

Sep. 18, 2001 (JP) .................................... 2001-283712

(51) Int. Cl.[7] ............................................... H01L 23/48
(52) U.S. Cl. ...................... 257/737; 257/774; 257/778
(58) Field of Search ................................. 257/737, 738, 257/778, 774

(56) References Cited

U.S. PATENT DOCUMENTS

| | | | | |
|---|---|---|---|---|
| 5,842,193 A | * | 11/1998 | Eichelberger | 257/723 |
| 5,998,875 A | * | 12/1999 | Bodo et al. | 257/778 |
| 6,028,354 A | * | 2/2000 | Hoffman | 257/706 |
| 6,277,669 B1 | * | 8/2001 | Kung et al. | 438/106 |

* cited by examiner

*Primary Examiner*—Roy Potter
(74) *Attorney, Agent, or Firm*—Volentine Francos, PLLC

(57) ABSTRACT

A semiconductor device includes a substrate; a metal layer formed on the substrate; an insulating layer, which is formed on the metal layer and is provided with a via-hole through it; and a bonding pad formed above the via-hole. The bonding pad comprises an inner portion arranged in the via-hole and an outer portion arranged above the via-hole. The boding pad is made of a conductive resin having a shock absorbing characteristic.

34 Claims, 7 Drawing Sheets

SEMICONDUCTOR DEVICE WITH SHOCK ABSORBING BOND PAD

CROSS REFERENCE TO RELATED APPLICATION

This application claims the priority of application Ser. No. 2001-283712, filed Sep. 18, 2001 in Japan, the subject matter of which is incorporated herein by reference.

TECHNICAL FIELD OF THE INVENTION

The present invention relates generally to a semiconductor device, and more particularly, to a structure of bonding pads and method for fabricating thereof.

BACKGROUND OF THE INVENTION

A conventional semiconductor device, shown in Japanese patent publication Kokai 2000-183104, includes bonding pads having two layers. One of the layers is made of tungsten, titanium or an alloy of tungsten and titanium, while the other layer is made of an aluminum system alloy including copper. Namely, such conventional bonding pads are made of metal layers.

According to the above-described conventional semiconductor device, mechanical shock or impact is transferred to the bonding pads and a circuitry arranged under the bonding pads in a wire-bonding process. The bonding pads and circuitry may be damaged in some cases. As a result, the reliability and yield of semiconductor devices are lowered.

OBJECTS OF THE INVENTION

Accordingly, it is an object of the present invention to provide a semiconductor device in which a bonding pad and circuitry arranged under the bonding pad are prevented from being damaged.

Another object of the present invention to provide a method for fabricating a semiconductor device in order that a bonding pad and circuitry arranged under the bonding pad are prevented from being damaged.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a semiconductor device includes a substrate; a metal layer formed on the substrate; an insulating layer, which is formed on the metal layer and is provided with a via-hole through it; and a bonding pad formed above the via-hole. The bonding pad comprises an inner portion arranged in the via-hole and an outer portion arranged above the via-hole. The boding pad is made of a conductive resin having a shock-absorbing characteristic.

According to a second aspect of the present invention, a method for fabricating a semiconductor device including: providing a substrate; forming a metal layer on the substrate; forming an insulating layer on the metal layer; forming a via-hole through the insulating layer; providing a conductive resin which has a shock absorbing characteristic; and filling the via-hole with a conductive resin to form an inner portion of a bonding pad. An outer portion of the bonding pad is formed with the conductive resin above the via-hole.

The bonding pad may be formed by dropping or dripping a liquid state of conductive resin into the via-hole in order that the conductive resin is filled in the vial hold for the inner portion and also overflow from the via-hole for the outer portion.

The semiconductor device may further include an enclosure formed around the via-hole on the insulating layer to define a peripheral boundary of the outer portion of the bonding pad. The enclosure can be formed on the insulating layer by the steps of: providing an insulating sheet, which is to be functioning as the enclosure; forming an opening on the insulating sheet at an area to be corresponding to the via-hole; and placing and adhering the insulating sheet with the opening onto the insulating layer.

The bonding pad may be formed by the steps of: providing a solid state conductive resin; placing the solid state conductive resin over the via-hole; and heating the conductive resin in order to melt the material and fill into the via-hole to form the inner portion, while a part of the conductive resin remaining on a protecting layer forms an outer portion.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

In the following description, some parts are cross-sections but are not illustrated with hatching in order to show features of the present invention clearly.

Figure 1A:
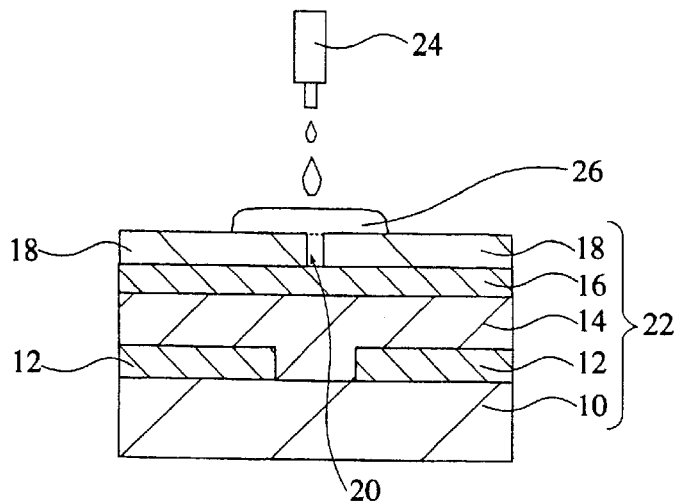
FIGS. 1A to 1C are cross-sectional views illustrating fabrication steps of a semiconductor device according to a first preferred embodiment of the present invention.
Figure 1B:
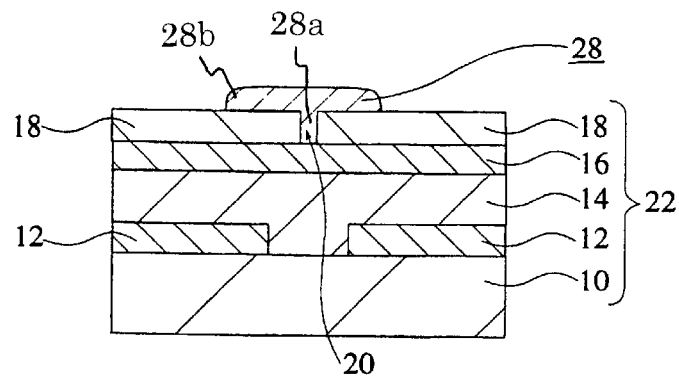
Figure 1C:
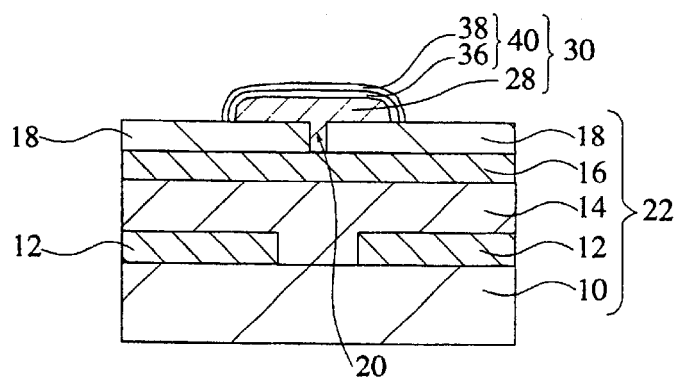

FIGS. 1A to 1C are cross-sectional views illustrating fabrication steps of a semiconductor device according to a first preferred embodiment of the present invention.

In the drawings, a layered structure 22 is used commonly for all the embodiments, and is described first. The layered structure 22 includes a semiconductor substrate 10, on which a semiconductor chip is mounted. A metal layer 12 is formed on the semiconductor substrate 10. The metal layer 12 is made of aluminum system alloy having a thickness of about $4.5 \times 10^2$ nm, and is patterned by etching. An oxide layer 14 is formed on the metal layer 12. The oxide layer 14 is made of oxide silicon having a thickness of about $8.0 \times 10^2$ nm, and is functioning as an interlayer insulating layer. Next, another metal layer 16 is formed on the oxide layer 14. The metal layer 16 is made of aluminum system alloy having a thickness of about $6.0 \times 10^2$ nm.

Subsequently, a protecting layer 18 is formed on the metal layer 16 to have a thickness of about $4.0 \times 10^2$ nm to $1.5 \times 10^3$ nm. The protecting layer 18 is made of silicon nitride. The protecting layer 18 is etched to have a via-hole 20 thereon. The metal layers 12 and 16 are electrically connected in a multi-layered structure in order to connect the semiconductor chip and a later described bonding pad.

Each of the following embodiments has a feature on bonding pads, formed on the layered structure 22.

FIRST EMBODIMENT

According to a first preferred embodiment, a bonding pad 30, formed above the via-hole 20, includes a core 28 having an inner portion 28a arranged in the via-hole 20 and an outer portion 28b arranged above the via-hole 20. The boding pad 30 also includes conductive coatings 36 and 38. The core 28 is made of a conductive resin having a shock-absorbing characteristic. The core 28 is formed by dropping or dripping a liquid state of conductive resin 26 into the via-hole 20 in order that the conductive resin 26 is filled in the via-hole 20 for the inner portion 28a and also overflow from the via-hole 20 for the outer portion 28b.

The conductive resin 26 is of a material including 60 to 70 weight % of conductive particles, a 10 to 20 weight % of epoxy resin and a 10 to 30 weight % of thinner or solution to provide about $1 \times 10^5 S*m^{-1}$ of electrical conductivity. The conductive particles are shaped to have an average diameter of between 1.0 to $1 \times 10^3$ nm. The viscosity of the conductive resin 26 is determined to have an enough liquidity or fluidity to be discharged from a supply device.

In fabrication, as shown FIG. 1A, 0.5 to 1.0 mg of the conductive resin 26 is dropped from a supply device 24 onto the layered structure 22. The conductive resin 26 is filled in the via-hole 20 and is provided on the protecting layer 18 at a certain area continuously. The outer portion 28b of the core 28 is formed with a part of the conductive resin 26 that is over flowed from the via-hole 20. The outer portion 28b is formed to have length and width of $1 \times 10^5$ nm and $1 \times 10^5$ nm, and have a thickness of $1 \times 10^4$ nm to $2 \times 10^4$ nm. The conductive resin 26 forms an electrical contact to the metal layer 16.

Next, as shown in FIG. 1B, the conductive resin 26 is heated to be hardened to provide the core 28 having a cushion or shock absorbing characteristic. More specifically, the layered structure 22 with the conductive resin 26 is heated at 100 to 200° C. (180° C. in general) in an inert gas, such as nitrogen, for a period of time of 30 to 120 minutes (60 minutes in general). As a result, the conductive resin 26 is hardened an forms the cushion layer 28.

Referring to FIG. 1C, a conductive coating 36 is formed over the outer portion 28b of the cushion layer 28 in an electroless deposition process. The conductive coating 36 is of, nickel having a thickness of about of $2 \times 10^3$ nm to $5 \times 10^3$ nm. Then, another conductive coating 38 is formed on the conductive coating 36 to have a thickness of $3 \times 10^2$ nm to $8 \times 10^2$ nm. The conductive coating 38 is of gold (Au) or platinum (Pd). The conductive coating 36 and 38 form a double-layered coating 40. The bonding pad 30 includes the cushion layer (cushion core) 28 and double-layered coating 40.

Figure 2A:
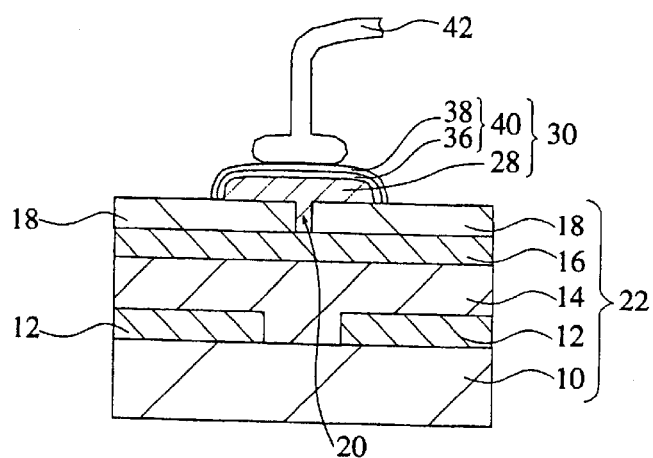
FIGS. 2A and 2B are cross-sectional views, each illustrating a fabrication step of the first preferred embodiment.

Next, referring to FIG. 2A, a bonding wire 42 is bonded on to the bonding bad 30. The bonding wire 42 is made of gold (Au).

Figure 2B:
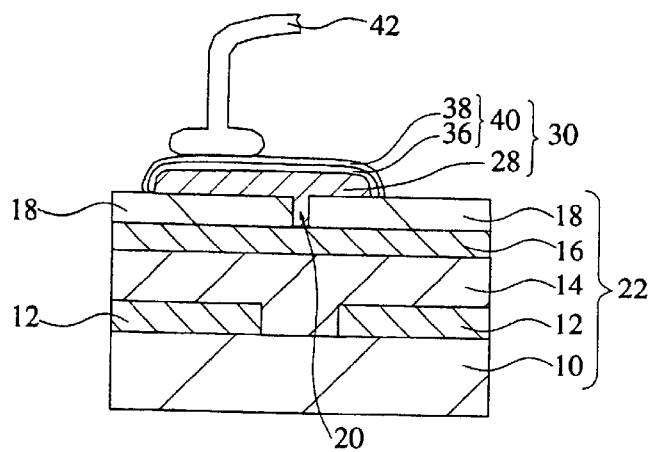

FIG. 2B shows another shape of bonding pad 30, the outer portion 28b and bonding wire 42 is offset from the via-hole 20. The cushion core 28 has a wider area on the protecting layer 18 as compared with that shown in FIG. 2A. The wider-area of cushion core 28 is formed by increasing the amount of conductive resin 26 to be dropped on to the protecting layer 18. According to this modification, an area where the boding wire 42 is to be bonded is increased; therefore the degree of freedom for determining the bonding spot becomes higher.

The thickness of the bonding pad 30 can be controlled by changing the amount of conductive resin 26, so that shock-absorbing characteristic of the bonding pad 30 is also adjustable.

According to the above-described first preferred embodiment, mechanical shock or impact is absorbed in the boding pad 30 in a wire-bonding process. Therefore, the bonding pads 30 and circuitry arranged under the bonding pads 30 are prevented from being damaged. As a result, the reliability and yield of semiconductor devices are improved.

SECOND EMBODIMENT

Figure 3A:
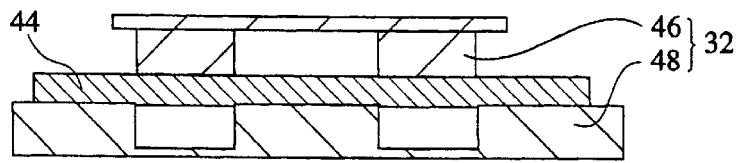
FIGS. 3A and 3B are cross-sectional views illustrating fabrication steps of a semiconductor device according to a second preferred embodiment of the present invention.
Figure 3B:
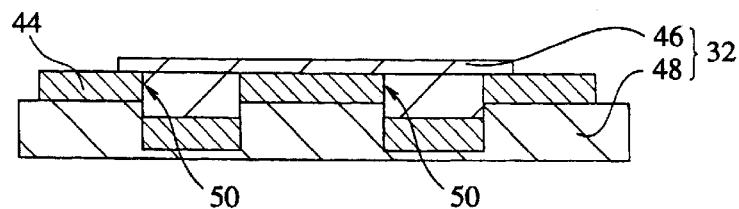
Figure 3C:
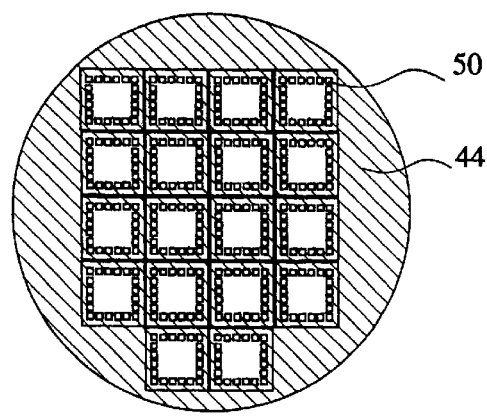
FIG. 3C is a top view illustrating a wafer used in the second preferred embodiment.
Figure 3D:
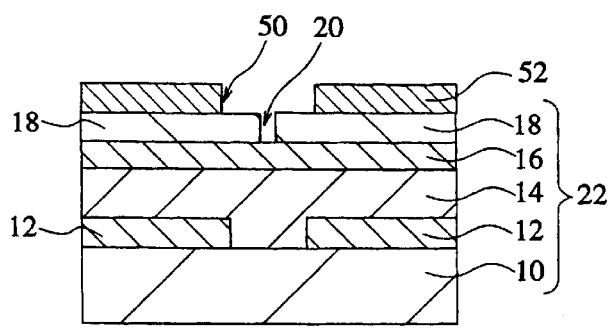
FIG. 3D is a cross-sectional view illustrating a fabrication step of the second preferred embodiment.
Figure 4A:
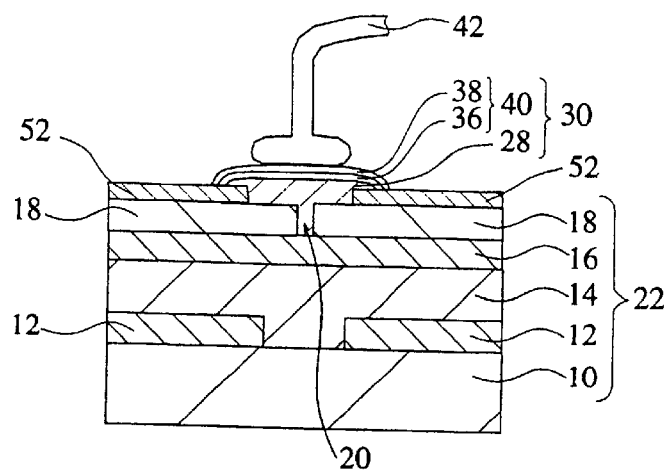
FIGS. 4A and 4B are cross-sectional views, each illustrating a fabrication step of the second preferred embodiment.
Figure 4B:
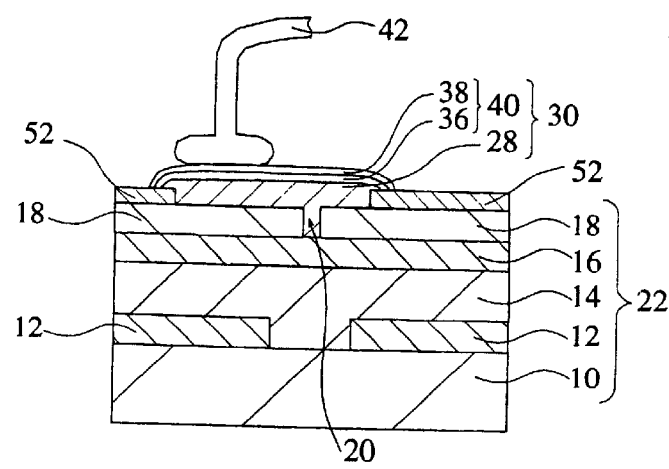

FIGS. 3A and 3B are cross-sectional views illustrating fabrication steps of a semiconductor device according to a second preferred embodiment of the present invention. FIG. 3C is a top view illustrating an insulating sheet on a wafer used in the second preferred embodiment. FIG. 3D is a cross-sectional view illustrating a fabrication step of the second preferred embodiment. FIGS. 4A and 4B are cross-sectional views, each illustrating a fabrication step of the second preferred embodiment.

In the second preferred embodiment, the same or corresponding elements to those in the first preferred embodiment are shown by the same reference numerals, and the same description is not repeated.

According to a second embodiment of the present invention, a semiconductor device further includes an enclosure 52 formed around the via-hole 20 on the protecting layer 18 to define a peripheral boundary of the outer portion 28b of the cushion core 28. The enclosure 52 is formed on the protecting layer 18 by the steps of: providing an insulating sheet 44, which is to be functioning as the enclosure 52; forming an opening 50 on the insulating sheet 44 at an area to be corresponding to the via-hole 20; and placing and adhering the insulating sheet 44 with the opening 50 onto the protecting layer 18.

The insulating sheet 44 is formed on a layered structure 22 to have a thickness of about $2 \times 10^4$ nm to $5 \times 10^4$ nm. The insulating sheet 44 is made of epoxy resin, polyimide resin or the like. The insulating sheet 44 is arranged between a first pressing member 46 and a first receiving member 48, as shown in FIG. 3A. The first pressing member 46 and first receiving member 48 compose a device for making the opening 50. The first pressing member 46 and first receiving member 48 are applied with a predetermined pressure so that a projected portion of the first pressing member 46 is fit into a depressed portion of the first receiving member 48. As a result, the opening 50 is formed, as shown in FIG. 3B. While the insulating sheet 44 is formed on a wafer, openings 50 are formed for all of the semiconductor devices on the wafer.

Next, the insulating sheet 44 having the opening 50 is put and aligned on the layered structure 22 as an enclosure 52. After that, the enclosure 52 is heated at a temperature in a range between 100 to 200° C., while the enclosure 52 is pressed to the layered structure 22 at a pressure of 1 to 5P so that the enclosure 52 is thermo-compression bonded to the layered structure 22.

Subsequently, in the same manner as the first preferred embodiment, a conductive resin 26 is dropped from a supply device 24 onto the layered structure 22. The conductive resin 26 is filled in the via-hole 20 and is provided on the protecting layer 18 at an area defined by the opening 50 of the enclosure 52. An outer portion 28b of a cushion core 28 is formed with a part of the conductive resin 26 that is over flowed from the via-hole 20. The outer portion 28b is formed to have length and width of $1 \times 10^5$ nm and $1 \times 10^5$ nm, and have a thickness of $1 \times 10^4$ nm to $2 \times 10^4$ nm. The conductive resin 26 forms an electrical contact to the metal layer 16.

Next, as shown in FIG. 1B, the conductive resin 26 is heated to be hardened to provide the core 28 having a cushion or shock absorbing characteristic. More specifically, the layered structure 22 with the conductive resin 26 is heated at 100 to 200° C. (180° C. in general) in an inert gas, such as nitrogen, for a period of time of 30 to 120 minutes (60 minutes in general). As a result, the conductive resin 26 is hardened to form the cushion layer 28.

Referring to FIG. 1C, a conductive coating 36 is formed over the outer portion 28b of the cushion layer 28 in an electroless deposition process. The conductive coating 36 is of nickel having a thickness of about of $2 \times 10^3$ nm to $5 \times 10^3$ nm. Then, another conductive coating 38 is formed on the conductive coating 36 to have a thickness of $3 \times 10^2$ nm to $8 \times 10^2$ nm. The conductive coating 38 is of gold (AU) or platinum (Pd). The conductive coating 36 and 38 form a double-layered coating 40. The bonding pad 30 includes the cushion layer (cushion core) 28 and double-layered coating 40.

Next, referring to FIG. 2A, a bonding wire 42 is bonded on to the bonding bad 30. The bonding wire 42 is made of gold (Au).

FIG. 2B shows another shape of bonding pad 30, the outer portion 28b and bonding wire 42 is offset from the via-hole 20. The cushion core 28 has a wider area on the protecting layer 18 as compared with that shown in FIG. 2A. The wider-area of cushion core 28 is formed by increasing the amount of conductive resin 26 to be dropped on to the protecting layer 18. According to this modification, an area where the boding wire 42 is to be bonded is increased; therefore the degree of freedom for determining the bonding spot becomes higher.

According to the second preferred embodiment, in the same manner as the first preferred embodiment, mechanical shock or impact is absorbed in the boding pad 30 in a wire-bonding process. Therefore, the bonding pads 30 and circuitry arranged under the bonding pads 30 are prevented from being damaged. As a result, the reliability and yield of semiconductor devices are improved.

Further, a spread area of the conductive resin 26 is restricted by the enclosure 52. Therefore, a desired shape of bonding pad 30 can be formed easily, and it can be prevented that the conductive resin 26 outflows to undesired areas. Further, a layer for the enclosure 52 can be formed on the wafer all over, so that cost increase can be minimized. In addition, it is not required to align the position of the resin supply device 24 so precisely as compared to the first preferred embodiment.

THIRD EMBODIMENT

Figure 5A:
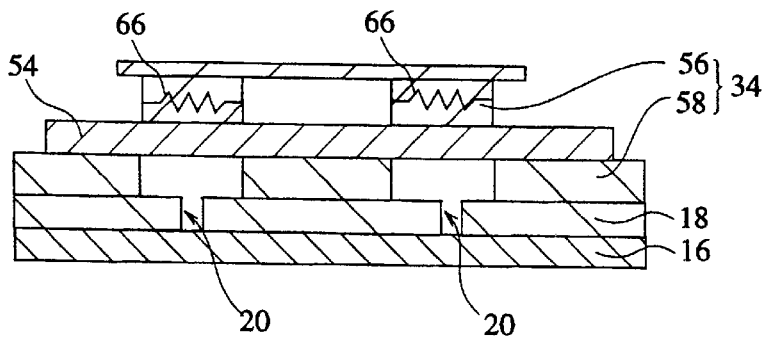
FIGS. 5A to 5D are cross-sectional views illustrating fabrication steps of a semiconductor device according to a third preferred embodiment of the present invention.
Figure 5B:
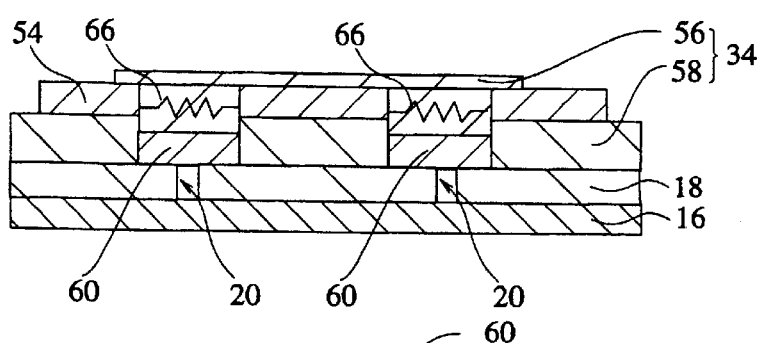
Figure 5C:
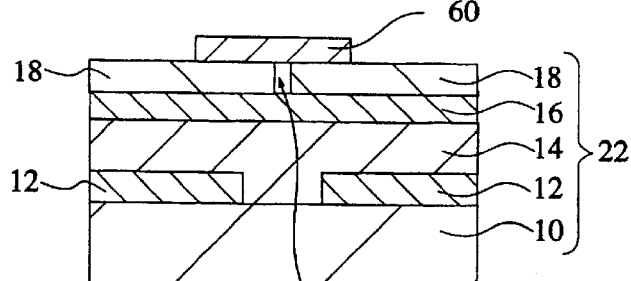
Figure 5D:
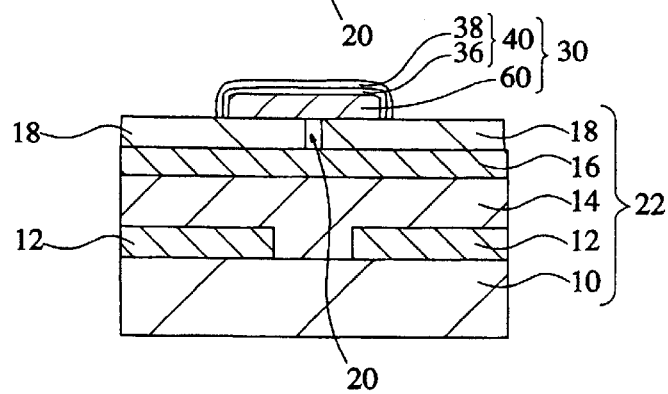
Figure 6A:
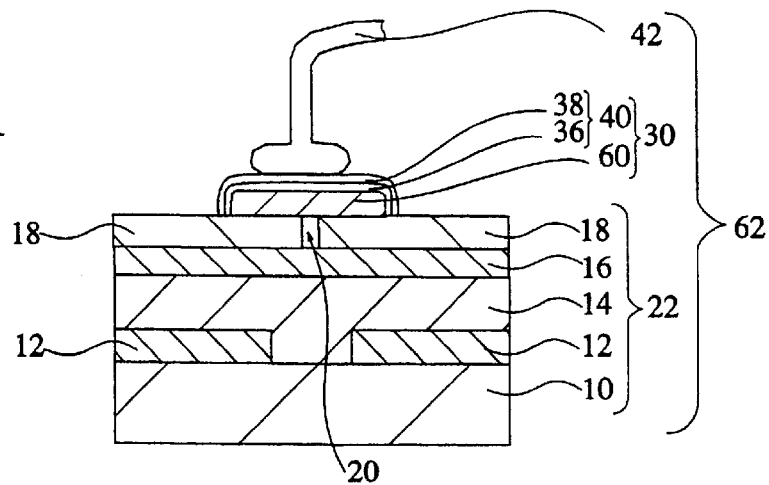
FIGS. 6A, 6B and 7 are cross-sectional views, each illustrating a fabrication step of the third preferred embodiment.
Figure 6B:
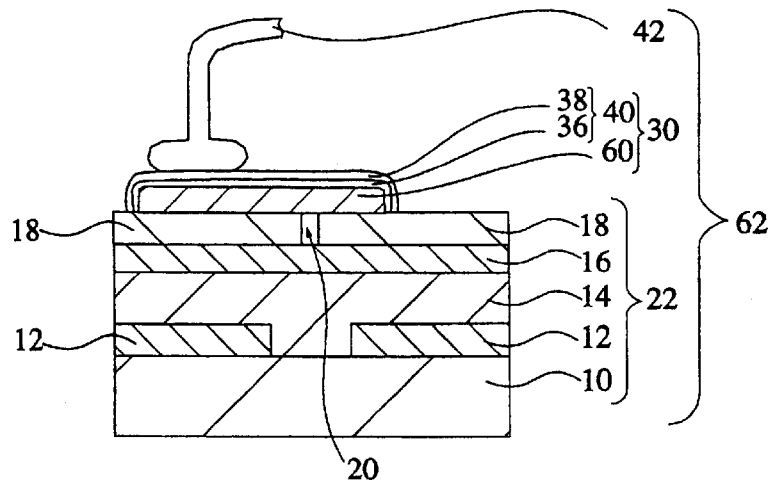
Figure 7:
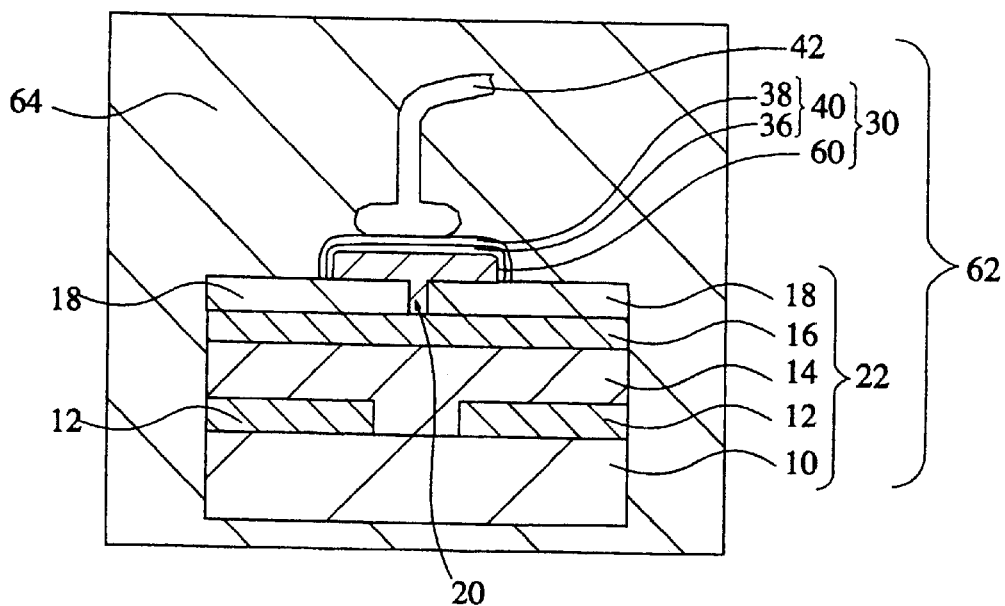

FIGS. 5A to 5D are cross-sectional views illustrating fabrication steps of a semiconductor device according to a third preferred embodiment of the present invention. FIGS. 6A, 6B and 7 are cross-sectional views, each illustrating a fabrication step of the third preferred embodiment.

In the third preferred embodiment, the same or corresponding elements to those in the first and second preferred embodiments are shown by the same reference numerals, and the same description is not repeated.

According to the third embodiment of the present invention, a bonding pad 30 is formed by the steps of: providing a solid state conductive resin 60; placing the solid state conductive resin 60 over a via-hole 20; and heating the conductive resin 60 in order to melt the conductive resin 60 and fill into the via-hole 20 to form an inner portion, while a part of the conductive resin 60 remaining on a protecting layer 18 forms an outer portion.

In fabrication of the solid-state conductive resin (60), which is functioning as a shock-absorbing layer or core, a punching device, including a second pressing member 56 having a projected portion and a second receiving member 58 having a depressed portion, is prepared. The solid-state conductive resin (60), which is shaped to be a sheet, is arranged between the second pressing member 56 and second receiving member 58. The second pressing member 56 and second receiving member 58 are applied with a predetermined pressure so that a projected portion of the second pressing member 56 is fit into a depressed portion of the second receiving member 58. As a result, a sheet shape of conductive resin 60 is pressed out onto the layered structure 22. The conductive resin sheet 60 is used as a shock-absorbing layer.

In the third preferred embodiment, a shock-absorbing film 54 is used. The shock-absorbing film 54 is made of a material including 30 to 50 weight % of conductive particles, such as gold (Au), silver (Ag) or the like, a 10 to 20 weight % of polyimide resin, 1 to 5 weight % of epoxy resin and a 25 to 59 weight % of admixture or low-stress material. The shock-absorbing film 54 is shaped to be a plate having a thickness of $2.0 \times 10^4$ to $5.0 \times 10^4$ nm and $1 \times 10^5 S \ast m^{-1}$ of electrical conductivity.

The conductive particles may include only one of polyimide resin and epoxy resin. In that case, the shock-absorbing film 54 is made of a material including 30 to 50 weight % of conductive particles, a 10 to 20 weight % of polyimide resin or epoxy resin and a 30 to 60 weight % of admixture or low-stress material.

As described above, the shock-absorbing film 54 is arranged between the second pressing member 56 and second receiving member 58. The second pressing member 56 and second receiving member 58 are applied with a predetermined pressure so that a projected portion of the second pressing member 56 is fit into a depressed portion of the second receiving member 58. As a result, a sheet shape of conductive resin 60 is pressed out onto the layered structure 22 so as to cover the via-hole 20, as shown in FIG. 5B.

The second pressing member 56 is provided therein with a heater 66, which is kept at 100 to 200° C. The shock-absorbing film 54 is heated by the heater 66 and is adhered onto the layered structure 22. In FIGS. 5A and 5B, for easy understanding, the layered structure 22 is not shown completely but only the metal layer 16 and protecting layer 18.

By using the punch device 34, the conductive resin sheets 60 are formed for all the semiconductor devices on a wafer all over at the same time.

Subsequently, in the same manner as the first preferred embodiment, referring to FIG. 5D, a conductive coating 36 is formed over the conductive resin sheet 60 in an electroless deposition process. The conductive coating 36 is of nickel having a thickness of about of $2 \times 10^3$ nm to $5 \times 10^3$ nm. Then, another conductive coating 38 is formed on the conductive coating 36 to have a thickness of $3 \times 10^2$ nm to $8 \times 10^2$ nm. The conductive coating 38 is of gold (Au) or platinum (Pd). The conductive coating 36 and 38 form a double-layered coating 40. The bonding pad 30 includes the cushion layer 60 and double-layered coating 40.

Next, referring to FIG. 6A, a bonding wire 42 is bonded on to the bonding bad 30. The bonding wire 42 is made of gold (Au).

FIG. 6B shows another shape of bonding pad 30, the conductive resin sheet 60 and bonding wire 42 is offset from the via-hole 20. The conductive resin sheet 60 has a wider area on the protecting layer 18 as compared with that shown in FIG. 6A. According to this modification, an area where the boding wire 42 is to be bonded is increased; therefore the degree of freedom for determining the bonding spot becomes higher.

Next, a resin-molding process is carried out to thus fabricated structure 62. The structure 62 is embedded in a mold resin 64, as shown in FIG. 7. A resin-molding process is carried out at a temperature of 170 to 190° C., and at a pressure of $1 \times 10^7$ P. An end of the bonding wire 42, which is not bonded to the bonding pad 30, is electrically connected to a predetermined conductive pattern (not shown).

During the resin-molding process, the conductive resin sheet 60 is melted and filled in the via-hole 20. A part of the conductive resin sheet 60, which is remaining on the protecting layer 18, is functioning as a core (outer portion) of the bonding pad 30.

According to the third preferred embodiment, in the same manner as the first preferred embodiment, mechanical shock or impact is absorbed in the boding pad 30 in a wire-bonding process. Therefore, the bonding pads 30 and circuitry arranged under the bonding pads 30 are prevented from being damaged. As a result, the reliability and yield of semiconductor devices are improved.

Further, a shock-absorbing film 54 having a precise thickness is used for forming a bonding pad, so that a wire-bonding process can be carried out reliably. In addition, the conductive resin sheet 60 can be formed on the wafer all over, so that cost increase can be minimized.

What is claimed is:

1. A semiconductor device, comprising:
    a substrate;
    a metal layer formed on the substrate;
    an insulating layer, which is formed on the metal layer and is provided with a via-hole through it; and
    a bonding pad formed above the via-hole, wherein
        the bonding pad comprises an inner portion arranged in the via-hole and an outer portion arranged above the via-hole, and
        the bonding pad is made of a conductive resin having a shock absorbing characteristic.

2. A semiconductor device according to claim 1, wherein the bonding pad further comprises a conductive coating formed over the outer portion thereof.

3. A semiconductor device according to claim 2, wherein the conductive coating comprises a first coating layer formed on the outer portion of the bonding pad and a second coating layer formed on the first coating layer.

4. A semiconductor device according to claim 3, wherein the first coating layer is made of nickel (Ni), and the second coating layer is made of a material selected one from gold (Au) and platinum (Pt).

5. A semiconductor device according to claim 1, wherein the inner and outer portions of the bonding pad are made of a material comprising conductive particles and a resin.

6. A semiconductor device according to claim 1, wherein the bonding pad is formed by dropping a liquid state of conductive resin into the via-hole in order that the conductive resin is filled in the vial hold for the inner portion and also overflow from the via-hole for the outer portion.

7. A semiconductor device according to claim 6, wherein the inner and outer portions of the bonding pad are made of a material comprising conductive particles, a resin and a thinner in order to obtain a desired viscosity for dropping.

8. A semiconductor device according to claim 7, wherein the inner and outer portions of the bonding pad are made of a material comprising 60 to 70 weight % of conductive particles, a 10 to 20 weight % of resin and a 10 to 30 weight % of thinner to provide about $1 \times 10^5 S * m^{-1}$ of electrical conductivity.

9. A semiconductor device according to claim 7, wherein the conductive particles have an average diameter of between 1.0 to $1 \times 10^3$ nm.

10. A semiconductor device according to claim 6, wherein the material forming the inner and outer portions of the bonding pad are heated to be hardened.

11. A semiconductor device according to claim 6, wherein the bonding pad further comprises a conductive coating formed over the outer portion thereof.

12. A semiconductor device according to claim 11, wherein
    the conductive coating comprises a first coating layer formed on the outer portion of the bonding pad and a second coating layer formed on the first coating layer.

13. A semiconductor device according to claim 12, wherein
    the first coating layer is made of nickel (Ni), and the second coating layer is made of a material selected one from gold (Au) and platinum (Pt).

14. A semiconductor device according to claim 6, wherein the outer portion of the bonding pad is offset from the via-hole on the insulating layer.

15. A semiconductor device according to claim 1, further comprising:
    an enclosure formed around the via-hole on the insulating layer to define a peripheral boundary of the outer portion of the bonding pad.

16. A semiconductor device according to claim 15, wherein
    the enclosure is made of an insulating resin.

17. A semiconductor device according to claim 15, wherein the enclosure is formed on the insulating layer by the steps of:
- providing an insulating sheet, which is to be functioning as the enclosure;
- forming an opening on the insulating sheet at an area to be corresponding to the via-hole; and
- placing and adhering the insulating sheet with the opening onto the insulating layer.

18. A semiconductor device according to claim 1, wherein the bonding pad is formed by the steps of:
- providing a solid state conductive resin;
- placing the solid state conductive resin over the via-hole; and
- heating the conductive resin in order to melt the material and fill into the via-hole to form the inner portion, while a part of the conductive resin remaining on the insulating layer forms an outer portion.

19. A semiconductor device according to claim 18, wherein
the conductive resin is heated in a resin molding process for packaging of the semiconductor device.

20. A semiconductor device according to claim 19, wherein
the inner and outer portions of the bonding pad are made of a material comprising conductive particles and a resin.

21. A semiconductor device according to claim 20, wherein
the inner and outer portions of the bonding pad are made of a material comprising 30 to 50 weight % of conductive particles and a 10 to 25 weight % of resin to provide about $1\times10^5 S*m^{-1}$ of electrical conductivity.

22. A semiconductor device according to claim 19, wherein
the bonding pad further comprises a conductive coating formed over the outer portion thereof.

23. A semiconductor device according to claim 22, wherein
the conductive coating comprises a first coating layer formed on the outer portion of the bonding pad and a second coating layer formed on the first coating layer.

24. A semiconductor device according to claim 23, wherein
the first coating layer is made of nickel (Ni), and the second coating layer is made of a material selected one from gold (Au) and platinum (Pt).

25. A semiconductor device according to claim 19, wherein
the outer portion of the bonding pad is offset from the via-hole on the insulating layer.

26. A method for fabricating a semiconductor device according to claim 1, comprising:
- providing a substrate;
- forming a metal layer on the substrate;
- forming an insulating layer on the metal layer;
- forming a via-hole through the insulating layer;
- providing a conductive resin which has a shock absorbing characteristic; and
- filling the via-hole with a conductive resin to form an inner portion of a bonding pad, wherein
  an outer portion of the bonding pad is formed with the conductive resin above the via-hole.

27. A method according to claim 26, wherein
the conductive resin is a liquid state before being filled in the via-hole,
the liquid state conductive resin is dropped into the via-hole for filling the via-hole with the conductive resin, and
the outer portion of the bonding pad is formed with remaining conductive resin overflowed from the via-hole.

28. A method according to claim 26, further comprising:
forming a conductive coating over the outer portion of the bonding pad.

29. A method according to claim 26, further comprising:
forming a first conductive coating over the outer portion of the bonding pad; and
forming a second conductive coating over the first conductive coating.

30. A method according to claim 27, further comprising:
heating the conductive resin to be hardened and to shape the inner and outer portions of the bonding pad.

31. A method according to claim 27, further comprising:
before dropping the conductive resin, forming an enclosure around the via-hole on the insulating layer to define a peripheral boundary of the outer portion of the bonding pad.

32. A method according to claim 31, wherein
the enclosure is formed on the insulating layer by the steps of:
- providing an insulating sheet, which is to be functioning as the enclosure;
- forming an opening on the insulating sheet at an area to be corresponding to the via-hole; and
- placing and adhering the insulating sheet with the opening onto the insulating layer.

33. A method according to claim 26, wherein
the bonding pad is formed by the steps of:
- providing a solid state conductive resin;
- placing the solid state conductive resin over the via-hole; and
- heating the conductive resin in order to melt the material and fill into the via-hole to form the inner portion, while an overflowed part of the conductive resin forms the outer portion.

34. A method according to claim 23, further comprising:
heating the conductive resin in a resin-molding process of the semiconductor device.

* * * * *